United States Patent
Wei et al.

(10) Patent No.: US 8,710,484 B2
(45) Date of Patent: Apr. 29, 2014

(54) METHOD FOR MANUFACTURING NON-VOLATILE MEMORY DEVICE, NON-VOLATILE MEMORY ELEMENT, AND NON-VOLATILE MEMORY DEVICE

(75) Inventors: Zhiqiang Wei, Osaka (JP); Takeshi Takagi, Kyoto (JP); Mitsuteru Iijima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/580,401

(22) PCT Filed: Feb. 23, 2011

(86) PCT No.: PCT/JP2011/001001
§ 371 (c)(1),
(2), (4) Date: Aug. 22, 2012

(87) PCT Pub. No.: WO2011/105060
PCT Pub. Date: Sep. 1, 2011

(65) Prior Publication Data
US 2012/0319072 A1    Dec. 20, 2012

(30) Foreign Application Priority Data
Feb. 23, 2010    (JP) .................................. 2010-036790

(51) Int. Cl.
*H01L 47/00*    (2006.01)
(52) U.S. Cl.
USPC .......................................................... 257/4
(58) Field of Classification Search
CPC ... H01L 27/2409; H01L 45/04; H01L 27/101; H01L 45/146
USPC .......... 257/2–5, 536–537, E29.326, E45.002; 438/54, 102–103, 382, 385
See application file for complete search history.

(56) References Cited

U.S. PATENT DOCUMENTS

| 7,397,688 B2 | 7/2008 | Tajiri |
| 7,800,091 B2 | 9/2010 | Kamigaichi et al. |
| 7,952,163 B2 | 5/2011 | Baek et al. |

(Continued)

FOREIGN PATENT DOCUMENTS

| JP | 2004-158804 | 6/2004 |
| JP | 2008-277543 | 11/2008 |

(Continued)

OTHER PUBLICATIONS

International Search Report issued May 24, 2011 in International (PCT) Application No. PCT/JP2011/001001.

*Primary Examiner* — Mark A Laurenzi
(74) *Attorney, Agent, or Firm* — Wenderoth, Lind & Ponack, LLP

(57) ABSTRACT

A manufacturing method for manufacturing, with a simple process, a non-volatile memory apparatus having a stable memory performance includes: (a) forming a stacking-structure body above a substrate by alternately stacking conductive layers comprising a transition metal and interlayer insulating films comprising an insulating material; (b) forming a contact hole penetrating through the stacking-structure body to expose part of each of the conductive layers; (c) forming variable resistance layers by oxidizing the part of each of the conductive layers, the part being exposed in the contact hole, and each of the variable resistance layers having a resistance value that reversibly changes according to an application of an electric signal; and (d) forming a pillar electrode in the contact hole by embedding a conductive material in the contact hole, the pillar electrode being connected to each of the variable resistance layers.

16 Claims, 15 Drawing Sheets

(56) References Cited

U.S. PATENT DOCUMENTS

| | | |
|---|---|---|
| 7,990,754 B2 | 8/2011 | Azuma et al. |
| 8,022,502 B2 | 9/2011 | Kanzawa et al. |
| 8,124,968 B2 | 2/2012 | Koo et al. |
| 8,154,909 B2 | 4/2012 | Azuma et al. |
| 2004/0090815 A1 | 5/2004 | Tajiri |
| 2008/0265235 A1 | 10/2008 | Kamigaichi et al. |
| 2009/0141547 A1 | 6/2009 | Jin et al. |
| 2009/0146190 A1 | 6/2009 | Fukuzumi et al. |
| 2009/0230512 A1 | 9/2009 | Baek et al. |
| 2009/0283736 A1 | 11/2009 | Kanzawa et al. |
| 2009/0321878 A1 | 12/2009 | Koo et al. |
| 2010/0172171 A1 | 7/2010 | Azuma et al. |
| 2011/0204315 A1 | 8/2011 | Baek et al. |
| 2011/0249486 A1 | 10/2011 | Azuma et al. |
| 2011/0294259 A1 | 12/2011 | Kanzawa et al. |
| 2012/0119180 A1 | 5/2012 | Koo et al. |

FOREIGN PATENT DOCUMENTS

| | | |
|---|---|---|
| JP | 2009-081251 | 4/2009 |
| JP | 2009-135328 | 6/2009 |
| JP | 2009-135489 | 6/2009 |
| JP | 2009-224778 | 10/2009 |
| JP | 2010-010688 | 1/2010 |
| JP | 2010-027753 | 2/2010 |
| WO | 2008/149484 | 12/2008 |
| WO | 2008/149493 | 12/2008 |

(a)

(b)

(a)

(b)

(a)

(b)

(a)

(b)

(a)

(b)

(a)

(b)

(a)

(b)

(a)

(b)

METHOD FOR MANUFACTURING NON-VOLATILE MEMORY DEVICE, NON-VOLATILE MEMORY ELEMENT, AND NON-VOLATILE MEMORY DEVICE

TECHNICAL FIELD

The present invention relates to a non-volatile memory element which has a resistance value that reversibly changes in response to an application of an electric signal, a non-volatile memory device including the element, and a method of manufacturing the non-volatile memory device.

BACKGROUND ART

With the progress of the digital technology in electric devices in recent years, demands for non-volatile memory devices with a large capacity have been increasing for storing data such as music, images, information, and so on. As a measure to meet such demands, a non-volatile memory device (hereinafter referred to as ReRAM) has been attracting attention, which includes, as a memory element, a variable resistance layer which has a resistance value that changes in response to a provided electric pulse and holds the state. This is because the ReRAM has characteristics that the structure as a memory element is comparatively simple and suitable for increasing density; and that it is easy to ensure consistency with conventional semiconductor processes. With such a ReRAM, a material which can stably cause a designed change in a resistance value with an excellent reproducibility even when a memory element is miniaturized, and establishment of a manufacturing process of the memory element are required. Research and development for such a material and a manufacturing process are actively conducted.

A memory device having a stacking structure is proposed as a structure allowing further dense integration in the ReRAM. FIG. 14 shows a cross-sectional diagram of a non-volatile memory device according to conventional examples disclosed by Patent Literatures 1, 2, and 3. The memory device includes: a stacked body in which a plurality of conductive layers 1413 and a plurality of interlayer insulating films 1417 are alternately stacked; a variable resistance layer 1414 formed to perpendicularly intersects the stacked body and to have a cylindrical shape; and a pillar electrode 1412 formed to be in contact with an inner side surface of the variable resistance layer 1414.

In addition, FIG. 15 shows a cross-sectional diagram of a non-volatile memory device according to the conventional example disclosed by Patent Literature 4. The memory device includes: an interlayer insulating film 1517 disposed parallel to a substrate 1511; conductive layers 1513 each disposed parallel to the substrate 1511 and shaped into a strip; a pillar electrodes 1512 each intersecting perpendicularly to the substrate 1511; and variable resistance layers 1514 disposed between the pillar electrodes 1512 and the conductive layers 1513.

The variable resistance layers 1514 are formed by oxidizing an overlap region in each of the conductive layers 1513. In the overlap region, the conductive layer 1513 intersects a corresponding one of the pillar electrodes 1512.

CITATION LIST

Patent Literature

[PTL 1] Japanese Unexamined Patent Application Publication No. 2009-81251

[PTL 2] Japanese Unexamined Patent Application Publication No. 2009-135489

[PTL 3] Japanese Unexamined Patent Application Publication No. 2009-135328

[PTL 4] Japanese Unexamined Patent Application Publication No. 2009-224778

SUMMARY OF INVENTION

Technical Problem

However, with the structures disclosed by Patent Literatures 1, 2, and 3, a step of embedding a desired material into a contact hole needs to be performed for the variable resistance layer 1414 and for the pillar electrode 1412; that is twice in total, and therefore the process is made complicated. In addition, there is another problem that it is difficult to control uniformly, in the depth direction of the contact hole, the thickness of the variable resistance layers 1414 to be formed.

In addition, with the structure disclosed by Patent Literatures 4, it is necessary to perform steps of patterning and etching in order to shape each of the variable resistance layers 1514 into a strip. Furthermore, during the step of etching, since a sidewall of each of the conductive layers 1513 is exposed, the conductive layer 1513 is partly oxidized in some cases due to spontaneous oxidation. This causes parasitic resistance on the conductive layer 1513, and the resistance value of the parasitic resistance is different between the variable resistance elements in the memory device. As a result, it is difficult to adjust the value of a driving voltage for changing the resistance value, and thus there is a problem that the variable resistance is unstable.

In addition, since each of the variable resistance layers 1514 is formed by oxidizing part of the conductive layer 1513 (an overlap region in which the conductive layer 1513 intersects a corresponding one of the pillar electrodes 1512), the variable resistance layer 1514 is formed into a shape shown in (b) in FIG. 15. When applying a voltage between the pillar electrode 1512 and the conductive layer 1513, since the thickness of the variable resistance layer 1514 in the direction of voltage application is not uniform, a larger current flows into a thinner region in the variable resistance layer 1514. As a result, there is another problem that the variable resistance element easily deteriorates due to concentration of current.

An object of the present invention is to provide a non-volatile memory element and a non-volatile memory device which solve the above-described problems, involve simple processes, and have a stable memory performance, and a method of manufacturing the same.

Solution to Problem

In order to solve the above-described problems, a method of manufacturing a non-volatile memory device according to an aspect of the present invention includes the steps of: (a) forming a stacking-structure body by alternately stacking a plurality of conductive layers and a plurality of interlayer insulating films above a substrate, each of the conductive layers comprising a transition metal, and each of the interlayer insulating films comprising an insulating material; (b) forming a contact hole penetrating through the stacking-structure body to expose an inner side surface of each of the conductive layers; (c) forming a plurality of variable resistance layers by oxidizing part of each of the conductive layers included in each of the layers of the stacking-structure body, the part being exposed in the contact hole, and each of the variable resistance layers having a resistance value that reversibly changes according to an application of an electric signal; and (d) forming a pillar electrode in the contact hole by embedding a conductive material in the contact hole, the pillar electrode having an outer side surface surrounded by and connected to each of the variable resistance layers.

In addition, in the step (b) of the method of manufacturing the non-volatile memory device, the contact hole may comprise a plurality of contact holes, and each of the contact holes may be disposed at a corresponding one of crosspoints of rows and columns in a two-dimensional matrix defined on the stacking-structure body, and the method may further comprise, subsequent to the step (b), the steps of: (e) forming one or more trenches for isolating the stacking-structure body for each portion composed of (i) a predetermined number of rows, (ii) a predetermined number of columns, or (iii) a predetermined number of rows and columns, in the two-dimensional matrix; and (f) embedding an insulating material in each of the one or more trenches. In addition, in the step (c) of the method of manufacturing a non-volatile memory device, each of the variable resistance layers may be formed to have an outer surface surrounded by a corresponding one of the conductive layers and to connect to the conductive layer. In addition, in the step (c) of the method of manufacturing a non-volatile memory device, each of the variable resistance layers may be annularly formed to have a constant width in a plane disposed parallel to the main surface of the substrate.

According to the above-described manufacturing method, the step of embedding a material into the contact hole includes only the step of embedding the pillar electrode, and thus it is possible to simplify the processes. In addition, by forming the variable resistance layer through the oxidation process, there is an advantage that it is easy to control the film thickness. In addition, since the variable resistance layer is formed concentrically with respect to the pillar electrode (for example, annularly formed to have a constant width and surround the pillar electrode), it is possible to form the variable resistance layer to have a uniform thickness in the direction of voltage application. In addition, by forming the conductive layer to be thicker in the direction of voltage application than the thickness of the variable resistance layer, it is possible to ignore the effect of the parasitic resistance even when the spontaneous oxidation occurs in the sidewall of the conductive layer.

In addition, in the step (c) of the method of manufacturing the non-volatile memory apparatus, each of the variable resistance layers may include a first variable resistance layer and a second variable resistance layer, and the second variable resistance layer may have an oxygen content smaller than an oxygen content of the first variable resistance layer, by performing an oxidation process twice.

According to the manufacturing method configured as described above, it is possible to further clarify the difference between the oxygen content of the first variable resistance layer and the oxygen content of the second variable resistance layer, by performing the oxidation process twice under different conditions, for example.

In addition, a non-volatile memory device according to an aspect of the present invention includes: a plurality of pillar electrodes disposed perpendicular to a main surface of a substrate; a plurality of conductive layers disposed parallel to the main surface of the substrate to intersect with the pillar electrodes, each of the conductive layers comprising a transition metal; a plurality of interlayer insulating films each of which is interposed between the conductive layers and which comprises an insulating material; and a plurality of variable resistance layers each of which is disposed exclusively at an intersection between each of the pillar electrodes and a corresponding one of the conductive layers each of the variable resistance layers comprising an oxide of the transition metal that is comprised in each of the conduction layers, and having (i) an inner side surface that surrounds an outer side surface of the corresponding one of the pillar electrodes, (ii) an outer side surface surround by each of the conductive layers in a corresponding one of the layers, and (iii) a resistance value that reversibly changes according to an application of an electric signal.

In addition, each of the variable resistance layers may have an oxygen content that decreases from an interface between each of the variable resistance layers and the corresponding one of the pillar electrodes toward the corresponding one of the conductive layers.

In addition, each of the conductive layers may be formed in an entire region between the variable resistance layers which are placed adjacent to each other in a plane parallel to the main surface of the substrate, each of the variable resistance layers may be formed in a plane parallel to the main surface of the substrate, by oxidizing the corresponding one of the conductive layers isotropically from the corresponding one of the pillar electrodes, and each of the variable resistance layers may be annularly formed to have a constant width.

In addition, each of the variable resistance layers may include a first variable resistance layer and a second variable resistance layer which are stacked in a direction parallel to the main surface of the substrate, the second variable resistance layer having an oxygen content smaller than an oxygen content of the first variable resistance layer.

In addition, each of the pillar electrodes may be disposed at a corresponding one of crosspoints of rows and columns in a two-dimensional matrix defined on the main surface of the substrate.

In addition, each of the conductive layers may be electrically insulated for each portion composed of (i) a predetermined number of rows, (ii) a predetermined number of columns, or (iii) a predetermined number of rows and columns, in the two-dimensional matrix.

In addition, the plurality of pillar electrodes may comprise a material including one of platinum, iridium, palladium, copper, and tungsten, and the transition metal comprised in the conductive layers and the variable resistance layers may be tantalum.

In addition, a selection transistor connected to one end of each of the pillar electrodes may further be comprised.

The non-volatile memory device configured as described above can be manufactured according to the above-described manufacturing methods or according to a combination of the above-described manufacturing methods and a known manufacturing method.

As a result, the step of embedding a material into the contact hole includes only the step of embedding the pillar electrode, and thus it is possible to simplify the processes. In addition, by forming the variable resistance layer through the oxidation process, there is an advantage that it is easy to control the film thickness. In addition, since the variable resistance layer is formed concentrically with respect to the pillar electrode (for example, annularly formed to have a constant width and surround the pillar electrode), it is possible to form the variable resistance layer to have a uniform thickness in the direction of voltage application. In addition, by forming the conductive layer to be thicker in the direction of voltage application than the thickness of the variable resistance layer, it is possible to ignore the effect of the parasitic resistance even when the spontaneous oxidation occurs in the sidewall of the conductive layer.

In addition, it is also possible to implement the present invention not only as the non-volatile memory device but also a non-volatile memory element included in the above-mentioned non-volatile memory device.

Advantageous Effects of Invention

According to the present invention, the variable resistance layer is formed by, after forming a contact hole, performing an oxidation process on part of a conductive layer that is exposed in the contact hole, and thus it is possible to simplify the manufacturing procedures. In addition, it is easy to control the uniformity of a thickness, so that the reliability of the non-volatile memory cell array increases.

DESCRIPTION OF EMBODIMENTS

The following describes embodiments according to the present invention, with reference to the drawings.

Embodiment 1

Figure 1:
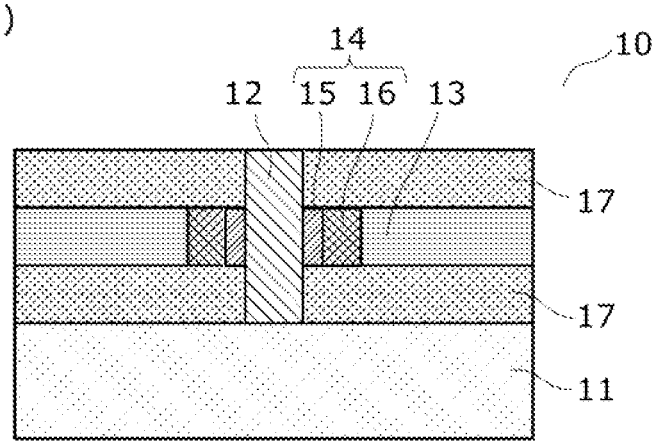
FIGS. 1 (a) and (b) in FIG. 1 show a cross-sectional diagram and a top view of a non-volatile memory element according to Embodiment 1 of the present invention.
Figure 1:
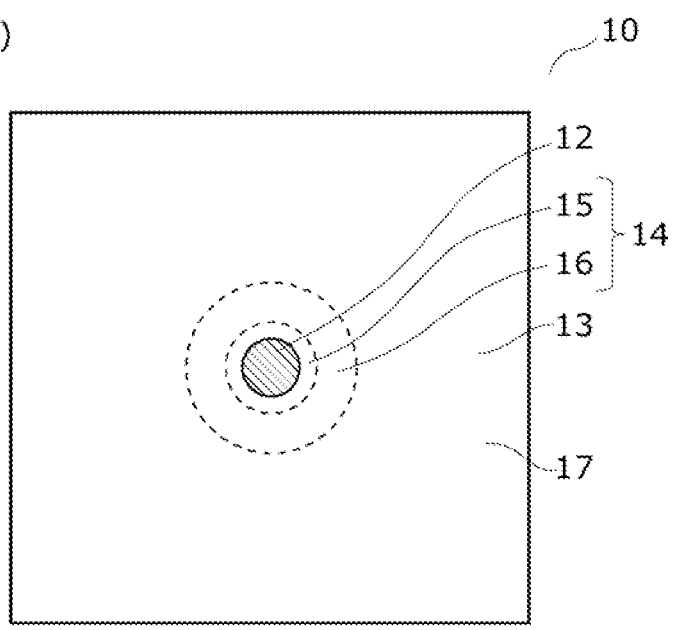

FIG. 1 shows a non-volatile memory element according to Embodiment 1 of the present invention. (a) in FIG. 1 is a cross-sectional diagram of a non-volatile memory element 10, and (b) in FIG. 1 is a top view of the non-volatile memory element 10 viewed from above (viewed in a direction perpendicular to a substrate 11).

The non-volatile memory element 10 shown in FIG. 1 includes: the substrate 11; a pillar electrode 12; a conductive layer 13; a variable resistance layer 14; and an interlayer insulating film 17. The variable resistance layer 14 includes a first variable resistance layer 15 and a second variable resistance layer 16.

The conductive layer 13 is formed parallel to a main surface of the substrate 11. The conductive layer 13 and a pair of interlayer insulating films 17 each of which is formed in contact with the conductive layer 13 at a corresponding one of the surfaces (an upper surface and a lower surface) of the conductive layer 13 configure a stacked body. The pillar electrode 12 is an electrode having: a central axis in a direction perpendicular to the main surface of the substrate 11; and a pillar shape penetrating through the stacked body. The variable resistance layer 14 includes the first variable resistance layer 15 and the second variable resistance layer 16, and is interposed between the pillar electrode 12 and the conductive layer 13. The first variable resistance layer 15 is a layer formed to have a cylindrical shape and an inner side surface that surrounds an outer side surface of the pillar electrode 12. The second variable resistance layer 16 is a layer formed to have a cylindrical shape and an inner side surface that surrounds, with its whole area, an outer side surface of the first variable resistance layer 15. The conductive layer 13 is disposed to surround an outer side surface of the second variable resistance layer 16. Accordingly, the conductive layer 13 is disposed to surround the pillar electrode 12.

It is to be noted that the variable resistance layer 14 is disposed exclusively at an intersection between the pillar electrode 12 and the conductive layer 13, and is not disposed at an intersection between the pillar electrode 12 and the interlayer insulating film 17.

In the non-volatile memory cell 10, the variable resistance layer 14 is interposed between the pillar electrode 12 and the first conductive layer 13. In addition, the variable resistance layer 14 has at least two states having different resistance values, and is capable of selectively causing a change from one state to another state, based on an application of an electric signal. Thus, the non-volatile memory element 10 is capable of selectively changing the resistance value between the pillar electrode 12 and the conductive layer 13, by applying a driving voltage or a driving current between the pillar electrode 12 and the conductive layer 13. The variable resistance layer 14, typically, has two states; that is, a high resistance state having a relatively high electric resistance value and a low resistance state having a low electric resistance value. At this time, the non-volatile memory element 10 changes from the high resistance state to the low resistance state, or from the low resistance state to the high resistance state, according to an application of a driving voltage or a driving current.

The variable resistance layer 14 comprises a metal oxide. Preferably, the variable resistance layer 14 comprises an oxygen-deficient metal oxide. A metal element of the metal oxide is preferably a transition metal, such as tantalum (Ta), hafnium (Hf), zirconium (Zr), titanium (Ti), tungsten (W), nickel (Ni), iron (Fe) and the like. Here, an oxygen-deficient metal oxide refers to a metal oxide having a smaller amount of oxygen content than a composition of a metal oxide having a stoichiometric composition (insulator, in general), and many of them generally behave like semiconductors. It is possible to stably cause a resistance change between binary resistance values with an excellent reproducibility, by using an oxygen-deficient oxide of the above-exemplified metal element for the variable resistance layer 14.

It is to be noted that, in Embodiment 1, it is sufficient for the variable resistance layer 14 to include a metal oxide that enables the resistance change, as a major variable resistance material. Thus, the variable resistance layer 14 may include a slight amount of an element other than the metal oxide. For example, it is possible to intentionally include a slight amount of another element into the variable resistance layer 14, for minor adjustment of the resistance value, and the like. Adding nitrogen to the variable resistance layer 14 increases the resistance value of the variable resistance layer 14, and thus it is possible to improve the reactivity of the resistance change. In addition, when forming the variable resistance layer 14 through sputtering, a slight amount of an element is unintentionally incorporated into the variable resistance layer 14 in some cases, due to a residual gas or gas emission from a vacuum chamber wall. As stated above, it is to be understood that a scope of the present invention also includes the case where a slight amount of an element is incorporated into the variable resistance layer 14.

The variable resistance layer 14 is formed by forming a contact hole perpendicularly to the stacked body including the conductive layer 13 and the interlayer insulating film 17, and then performing the oxidation process on part of the conductive layer 13 exposed in the contact hole. Accordingly, the variable resistance layer is formed in a self-aligned manner with respect to the conductive layer 13. Accordingly, the step of embedding a material into the contact hole includes only one step of embedding the pillar electrode 12, and thus it is possible to simplify the processes. In addition, by forming the variable resistance layer 14 through the oxidation process, there is an advantage that it is easy to control the thickness of the variable resistance layer 14. In addition, since the variable resistance layer 14 is formed concentrically with respect to the pillar electrode 12 (in other words, annularly formed to have a constant width and surround the pillar electrode 12), it is possible to form the variable resistance layer 14 to have a uniform thickness in the direction of voltage application. In addition, by forming the conductive layer 13 to be thicker in the direction of voltage application than the thickness of the variable resistance layer 14, it is possible to ignore the effect of the parasitic resistance even when the spontaneous oxidation occurs in the sidewall of the conductive layer 13.

The oxygen content of the variable resistance layer 14 decreases from an interface between the variable resistance layer 14 and the pillar electrode 12, toward the first conductive layer 13. It is possible to form the variable resistance layer 14 through an oxidation process such that the oxygen content of the variable resistance layer 14 continuously decreases with distance from the pillar electrode 12. This is because that, in the oxidation process, the amount of oxygen entering an inside of the conductive layer 13 decreases with distance from a contact hole. Among them, a layer having comparatively a higher oxygen content is the first variable resistance layer 15 and the layer having comparatively a lower oxygen content is the second variable resistance layer 16. In this case, since the oxygen content gradually decreases according to the distance from the surface on which the oxidation process is performed, the stacking structure is not defined as definitively as the stacking structure shown in (a) in FIG. 1. However, since it is important that the oxygen content of the region of the first variable resistance layer 15 is larger than the oxygen content of the second variable resistance layer 16, the stacking structure is used for illustration so as to be easily understood.

In addition, it is also possible to further clarify the difference between the oxygen content of the first variable resistance layer 15 and the oxygen content of the second variable resistance layer 16, by performing the oxidation process twice under different conditions. It is estimated that the first variable resistance layer 15 receives an oxygen ion from the second variable resistance layer 16 in response to an application of a driving voltage or a driving current having a positive polarity in the pillar electrode 12 with reference to the conductive layer 13 (a current flows in the direction from the first variable resistance layer 15 to the second variable resistance layer 16) and the oxygen content atomic percentage increases, thereby changing to the high resistance state. On the other hand, it is estimated that the first variable resistance layer 15 diffuses the oxygen ion to the second variable resistance layer 16 in response to an application of a driving voltage or a driving current having a negative polarity in the pillar electrode 12 with reference to the conductive layer 13 and the oxygen content atomic percentage decreases, thereby changing to the low resistance state. It is to be noted that the first variable resistance layer 15 may change to the low resistance state exclusively in part of the region of the first variable resistance layer 15. For the details of the role of the second variable resistance layer as described above and the experimental data that is the basis thereof, the invention described in WO 2008/149484 filed by the Applicant of the present application should be referred to.

It is to be noted that the variable resistance layer 14 is not limited to having two layers. In order to trigger resistance changing phenomenon in the variable resistance layer 14 composed of one layer, a forming process may be performed on the variable resistance layer 14. The forming process is a process of applying, once or plural times, a positive and negative voltage higher than a voltage applied during a normal operation, to the variable resistance layer 14, in order to electrically form a layer having a large amount of oxygen content in a region of the variable resistance layer 14 near the interface to the pillar electrode 12.

The pillar electrode 12 may comprise a material which excels in conductivity (in resistivity, for example, equal to or less than 10 mΩ·cm) and of which the major metal material of the pillar electrode 12 has a standard electrode potential that is higher than a standard electrode potential of a metal included in the variable resistance layer 14. Specific examples of the material of the pillar electrode 12, for the material of the above-described variable resistance layer, include: platinum (Pt), iridium (Ir), palladium (Pd), copper (Cu), tungsten (W) (excepting the case where the variable resistance layer is a tungsten oxide), and so on. It is to be noted that the pillar electrode 12 may include a thin film formed of the above-exemplified material, on an outer periphery of the conductive body comprising tungsten (W) or the like.

In addition, it is preferable that the standard electrode potential of the metal used for the pillar electrode 12 is larger than the standard electrode potential of the metal used for the first conductive layer 13 and the variable resistance layer 14. With this, the pillar electrode 12 becomes difficult to be oxidized, and the oxygen content of the variable resistance layer 14 near the interface to the pillar electrode 12 changes, thereby stabilizing resistance changing phenomenon.

The first conductive layer 13 comprises: an oxygen-deficient metal oxide having less oxygen content (in resistivity, for example, less than or equal to 10 mΩ·cm); a nitrogen-deficient metal oxide having less nitrogen content; or a metal which does not include oxygen or nitrogen. In the former case, there is an advantage that the variable resistance layer 14 is easily formed from the first conductive layer 13. In the latter case, there is an advantage that resistance of the first conductive layer 13 decreases and thus power consumption can be reduced.

Figure 2:
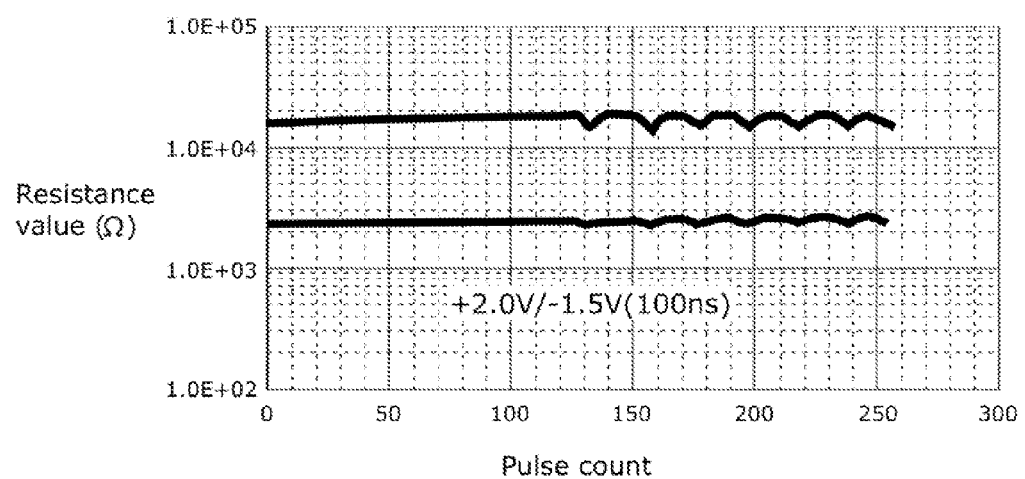
FIG. 2 is a graph which shows an example of a resistance change operation in the non-volatile memory element according to Embodiment 1 of the present invention.

When writing information on the non-volatile memory element 10, binary electric pulses are alternately applied to the variable resistance layer 14 to program. FIG. 2 is a graph which shows an example of an operation of resistance change in the non-volatile memory element 10 according to Embodiment 1. The vertical axis represents resistance values and the horizontal axis represents counts of electric pulses applied alternately with binary voltage values.

The non-volatile memory element 10 used in the operation example includes: the pillar electrode 12 which comprises platinum; the first variable resistance layer 15 which comprises tantalum oxide $TaO_y$ having a large amount of oxygen content; the second variable resistance layer 16 which comprises tantalum oxide $TaO_x$ having a small amount of oxygen content; and the conductive layer 13 which comprises tantalum. The preferable composition range of the tantalum oxide $TaO_x$ having a small amount of oxygen content is $0<x<2.5$, and the preferable composition range of the tantalum oxide $TaO_y$ having a large amount of oxygen content is $x<y$. This is because that $TaO_x$ and $TaO_y$ stably show the resistance changing phenomenon with an excellent reproducibility in these ranges. It is to be noted that, with the above-described composition range, it cannot be avoided that a slight amount of impurity (an additive for adjusting the resistance value, for example) is included in the first variable resistance layer 15 and the second variable resistance layer 16 in addition to the tantalum oxide.

For the details of the reason for the estimation that resistance changing phenomenon occurs in the above-described ranges and the experimental data that is the basis thereof, the invention described in WO 2008/149484 filed by the Applicant of the present application should be referred to.

In the above-described non-volatile 10, when electric pulses having (i) a pulse width of 100 ns and (ii) two types of voltage values each having a different polarity are alternately applied between the pillar electrode 12 and the conductive layer 13, the resistance values of the variable resistance layer 14 changes as shown in FIG. 2. More specifically, when a negative voltage pulse (having a voltage E1 and a pulse width 100 ns) is applied to the pillar electrode 12 with respect to the conductive layer 13, the resistance value of the variable resistance layer 14 decreases from a high resistance value Rb (approximately 15kΩ in the case of the example shown in FIG. 2) to a low resistance value Ra (approximately 2.4kΩ in the case of the example shown in FIG. 2). On the other hand, when a positive voltage pulse (having a voltage E2 and a pulse width 100 ns) is applied to the pillar electrode 12 with respect to the conductive layer 13, the resistance value of the variable resistance layer 14 increases from the low resistance value Ra to the high resistance value Rb. It is to be noted here that the voltage E1 is assumed to be −1.5V and the voltage E2 is assumed to be +2.0V.

As clearly shown in the operation example in FIG. 2 described above, the non-volatile memory element 10 according to Embodiment 1 shows a resistance changing phenomenon which is reversible between the high resistance state and the low resistance state, in response to the positive and negative pulses applied between the conductive layer 13 and the pillar electrode 12, and thus has a preferable variable resistance characteristic.

Embodiment 2

Figure 3:
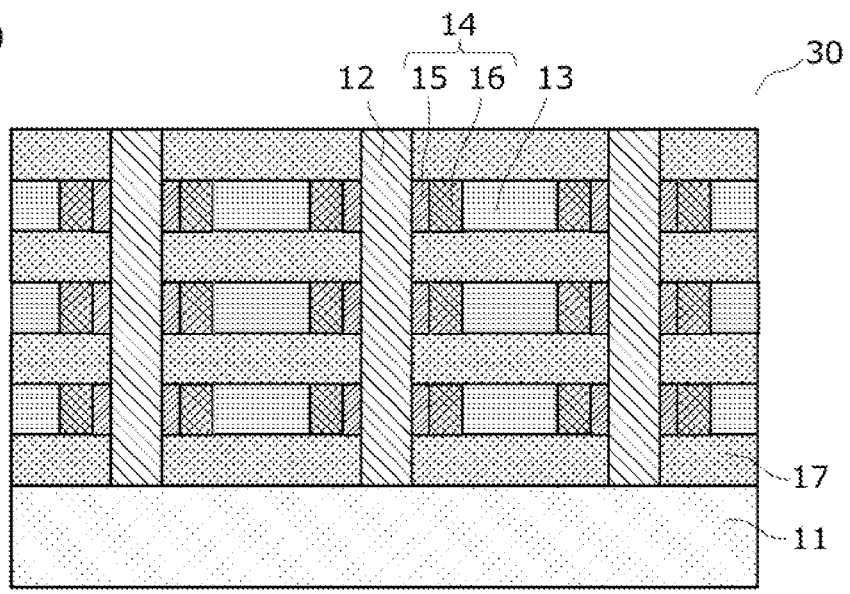
FIGS. 3 (a) and (b) in FIG. 3 show a cross-sectional diagram and a top view of a non-volatile memory device according to Embodiment 2 of the present invention.
Figure 3:
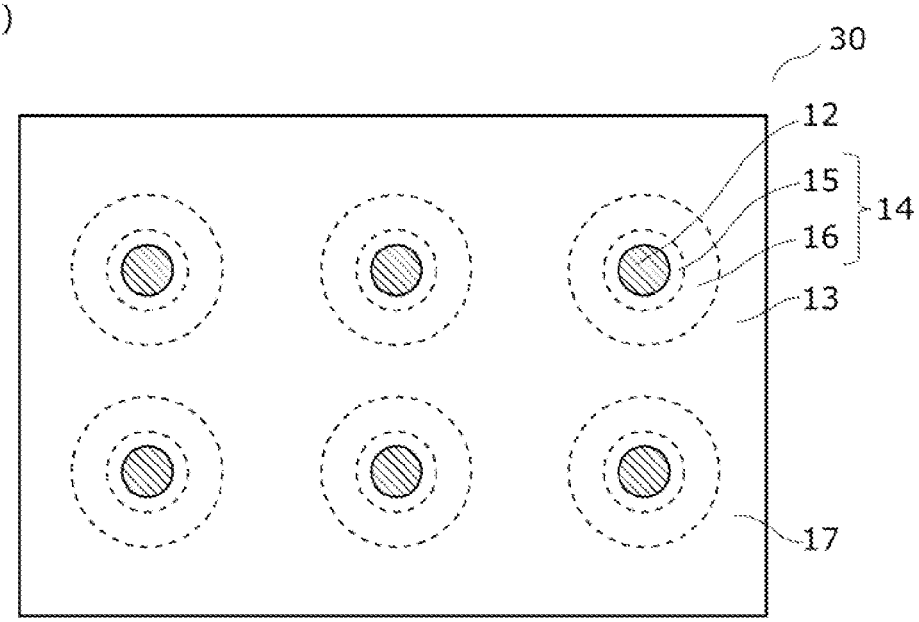

FIG. 3 shows a non-volatile memory device 30 according to Embodiment 2 of the present invention. (a) in FIG. 3 is a cross-sectional diagram of the non-volatile memory device 30, and (b) in FIG. 3 is a top view of the non-volatile memory device 30 viewed from above (viewed in a direction perpendicular to a substrate 11).

As shown in (a) and (b) in FIG. 3, the non-volatile memory device 30 is a memory array in which three layers each having six memory cells are stacked in the lengthwise direction (in a direction perpendicular to the substrate) and a total of 18 memory cells are three-dimensionally arranged. Here, each of the memory cells corresponds to the non-volatile memory element 10 in Embodiment 1, and includes the pillar electrode 12, the conductive layer 13, the variable resistance layer 14, and the interlayer insulating film 17.

With the non-volatile memory device 30, in the same manner as Embodiment 1, the variable resistance layer 14 is formed by performing an oxidation process on part of the first conductive layer 13, which is exposed in a contact hole in after forming the contact hole, and thus it is possible to simplify the processes. In addition, the variable resistance layer 14 is formed exclusively at an intersection of the pillar electrode 12 and the first conductive layer 13. With this configuration, it is possible to implement a memory array in which the variable resistance layer 14 is isolated for each of the memory cells, thereby enabling reduction in a sneak leak current to an unselected memory cell. Furthermore, compared to the thickness of the variable resistance layer formed by embedding, the thickness of the variable resistance layer 14 formed by the oxidation process can be controlled more uniformly over a plurality of variable resistance layers 14 in the contact hole. Thus, the reliability of the non-volatile memory device 30 of the stacking structure improves.

As shown in (a) in FIG. 3, the conductive layer 13 and the interlayer insulating film 17 are alternately stacked parallel to a main surface of the substrate 11. Here, each of the conductive layers 13 has a plate-like planar configuration extending in the same surface and serves as a word line. In addition, the pillar electrodes 12 each having a pillar shape perpendicular to the main surface of the substrate 11, is disposed two-dimensionally in a row direction and a column direction in a plane parallel to the main surface of the substrate 11, and serves as a bit line. In the same manner as Embodiment 1, the variable resistance layers 14 are disposed at crosspoints of the pillar electrodes 12 (bit lines) and the conductive layers 13 (word lines). As described above, each of the conductive layers 13 (word line) is conductive in the plane, thereby enabling simplification of the processes and improving the integration of the memory cells.

Figure 4:
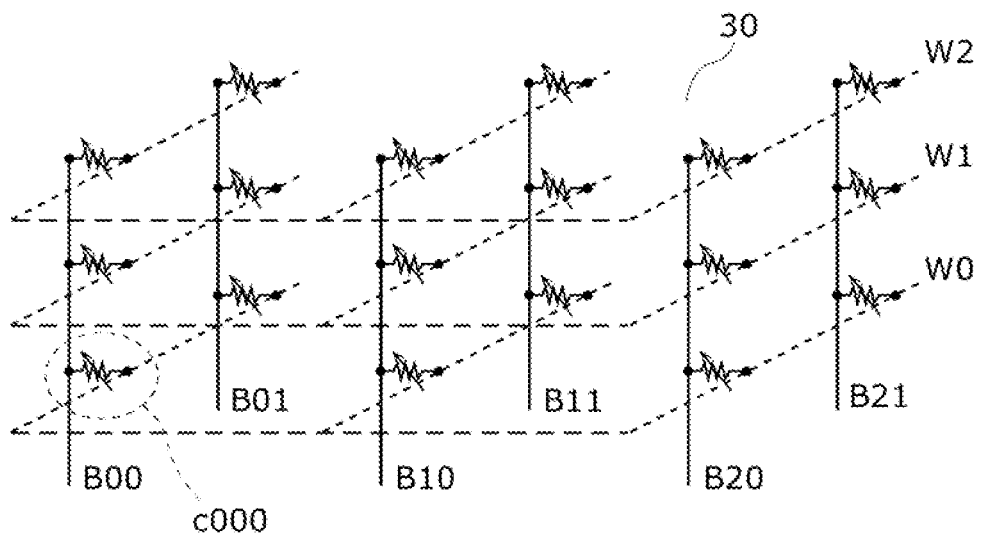
FIG. 4 is an equivalent circuit diagram of the non-volatile memory device according to Embodiment 2 of the present invention.

FIG. 4 is an equivalent circuit diagram of the non-volatile memory device 30 according to Embodiment 2 of the present invention, in FIG. 4, the variable resistance layers 14 are provided at crosspoints of the pillar electrodes 12 (bit line:

B00, B01, B21, . . . ) and the conductive layers 13 (word line: W0, W1, W2, . . . ). More specifically, the state of a resistance value of the memory cell C000 can be changed by selecting one of the bit lines (B00, for example) and one of the word lines (W0, for example) and applying a driving voltage to the memory cell C000 that is positioned at the crosspoint thereof.

Accordingly, when assigning information in association with the state of the resistance value of the memory cell C000, it is possible to write information to or read information from the memory cell C000 by applying a driving voltage to the bit line and the word line each of which is connected to the memory cell C000. As a result, it is possible to implement the non-volatile memory device 30 that has random access capability.

Embodiment 3

Figure 5:
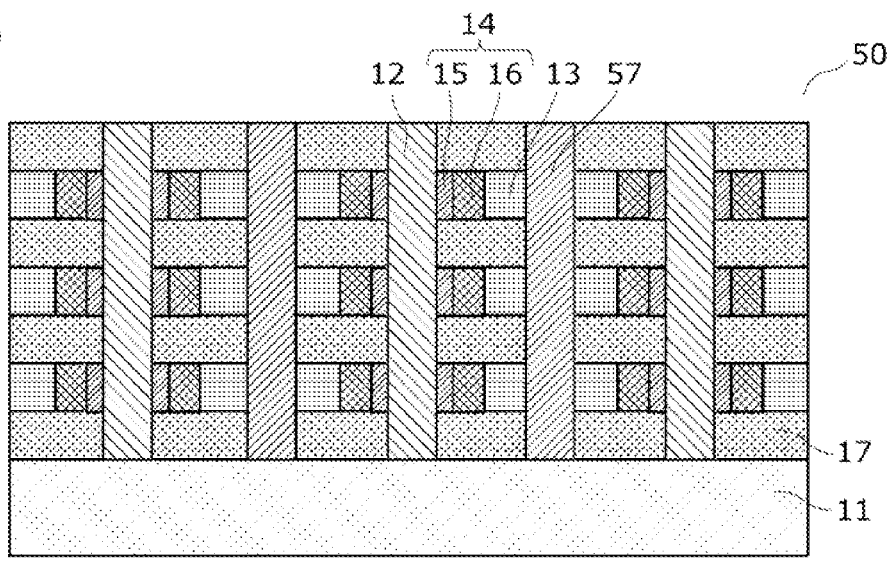
FIGS. 5 (a) and (b) in FIG. 5 show a cross-sectional diagram and a top view of a non-volatile memory device according to Embodiment 3 of the present invention.
Figure 5:
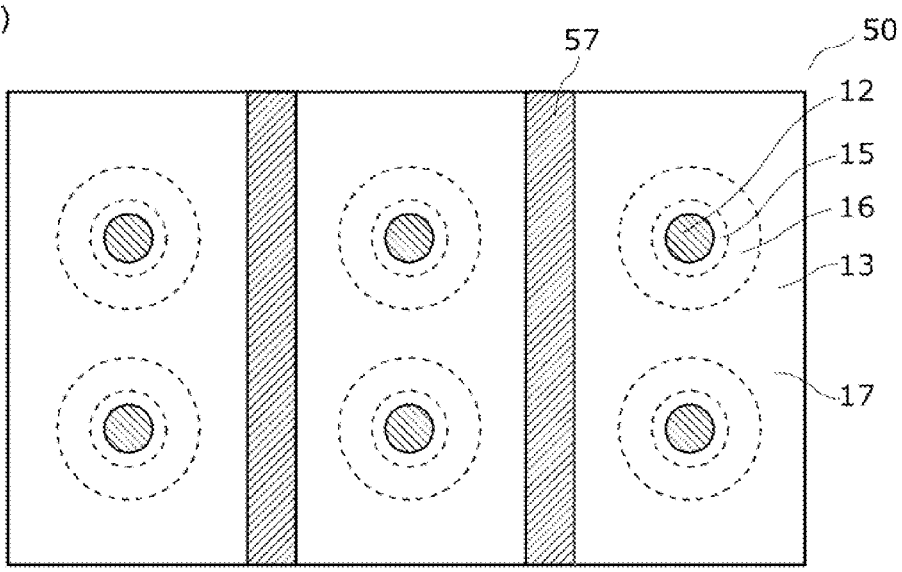

FIG. 5 shows a non-volatile memory device 50 according to Embodiment 3 of the present invention. The non-volatile memory device 50 according to Embodiment 3 is a modification example of the non-volatile memory device 30 according to Embodiment 2. (a) in FIG. 5 is a cross-sectional diagram of the non-volatile memory device 50, and (b) in FIG. 5 is a top view of the non-volatile memory device 50 viewed from above (viewed in a direction perpendicular to the substrate 11). In the same manner as the present Embodiment 2, it is possible to simplify the processes and control the uniformity of the thickness of the variable resistance layer 14, according to Embodiment 3 as well.

As shown in (a) and (b) in FIG. 5, Embodiment 3 differs from Embodiment 2 in that strip-shaped insulating layers 57 are formed perpendicular to the main surface of the substrate 11 such that each of the insulating layers 57 isolates, for each row, the pillar electrodes 12 arranged two-dimensionally in a row direction and a column direction in a plane parallel to the main surface of the substrate 11. More specifically, the conductive layers 13 which serve as word lines are electrically insulated for each column by the insulating layers 57.

Figure 6:
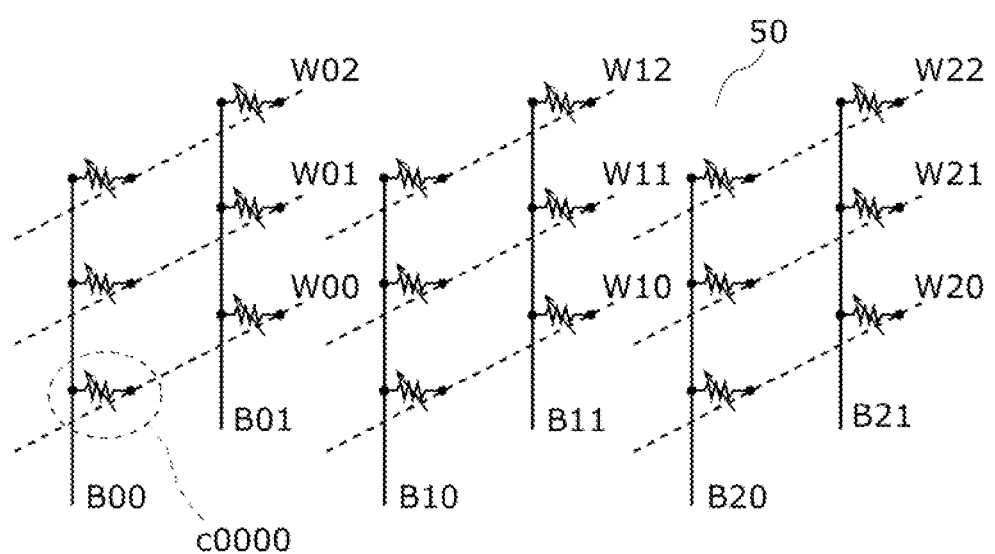
FIG. 6 is an equivalent circuit diagram of the non-volatile memory device according to Embodiment 3 of the present invention.

FIG. 6 is an equivalent circuit diagram of the non-volatile memory device 50 according to Embodiment 3 of the present invention. In Embodiment 3, it is possible, by selecting one of the bit lines (for example, B00) and one of the word lines (for example, W00), to write information to and read information from the memory cell C0000 that is positioned at the crosspoint of the selected bit line and the selected word line. According to this configuration, as clearly shown by the comparison of FIG. 6 and FIG. 4, the number of memory cells electrically connected to the word line (for example, W00) is tower than the number of memory cells electrically connected to the word line (for example, W0) in Embodiment 2. With this configuration, it is possible to reduce a sneak leak current to an unselected memory cell, thereby enabling the reduction in power consumption. It is to be noted that the insulating layer 57 is not limited to the insulating layer 57 that isolates the pillar electrodes 12 (bit lines) for each column, and the insulating layer 57 may isolate the pillar electrodes 12 for each unit composed a predetermined two or more rows. In addition to isolating for each row, the insulating layer 57 may isolate the pillar electrodes 12 for each unit composed of a predetermined number of columns, or may isolate the pillar electrodes 12 for each combination of a row unit and a column unit.

Embodiment 4

The non-volatile memory device 40 according to Embodiment 4 includes a selection circuit 41 for the pillar electrode 12 (bit line) in addition to the configuration of the non-volatile memory device 30 of Embodiment 2. (a) in FIG. 7 is an equivalent circuit diagram of the non-volatile memory device 40 that includes the selection circuit 41 according to Embodiment 4, and (b) in FIG. 7 is a top view of a selection transistor included in the selection circuit 41 viewed from above.

As shown in (a) in FIG. 1, the selection transistor is connected to source lines (S0 and S1), gate lines (G0 to G2), and bit lines (B00 to B21). In the transistor according to this configuration, one of the source lines (for example, S0) and one of the gate lines (for example, G0) are selected, thereby enabling selecting of one of the transistors connected to those lines. In the case where S0 and G0 are selected, for example, the transistor G0 selected this time is connected to one of the bit lines (B00). Accordingly, it is possible to select the memory cell C000 that is positioned at the crosspoint of the bit line (B00) and the word line (W0), by further selecting one of the word lines (for example, W0).

It is to be noted that the selection circuit 41 including the selection transistor of Embodiment 4 may be used for the non-volatile memory device 50 of Embodiment 3.

Figure 7:
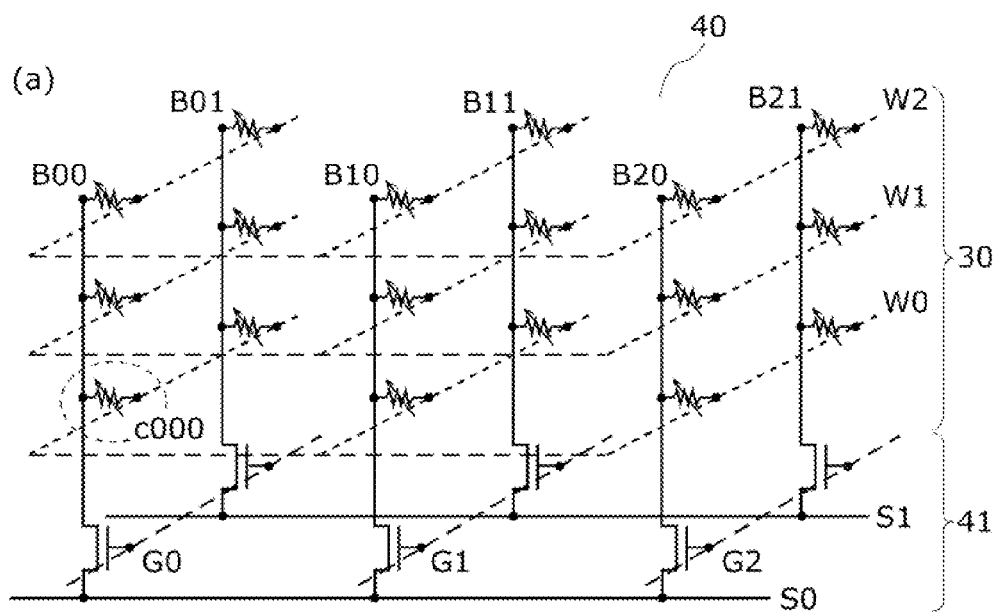
FIG. 7 (a) in FIG. 7 is an equivalent circuit diagram of a non-volatile memory device including a selection transistor according to Embodiment 4 of the present invention, and (b) in FIG. 7 is a top view of the selection transistor viewed from above.
Figure 7:
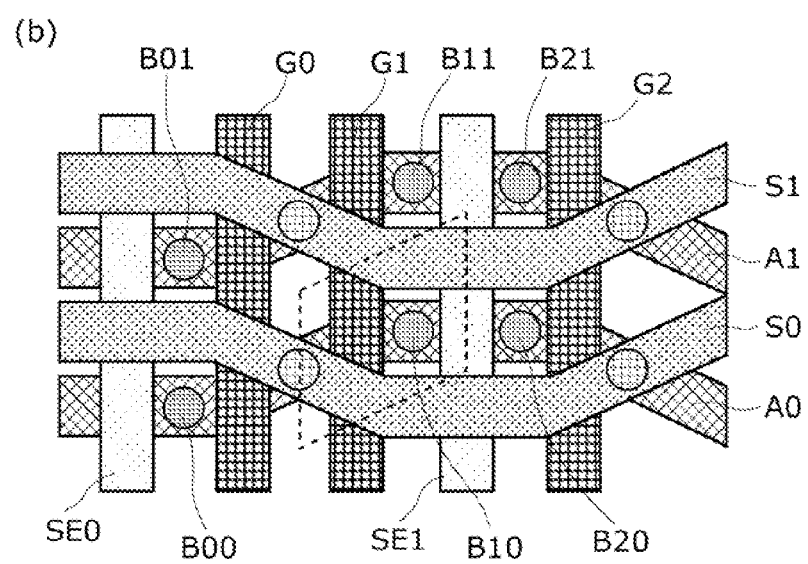

(b) in FIG. 7 shows a configuration of the selection transistor. More than one active regions (A0, A1), more than one conductive source lines (S0, S1), and more than one conductive gate lines (G0, G1, G2) are formed parallel to the main surface of the substrate.

Each of the active regions (A0, A1) includes a region in which an impurity is doped and is included in a source or a drain of the transistor. The active regions (A0, A1) and the conductive source lines (S0 and S1) have respectively bending shapes in a plane. Each of the conductive source lines (S0 and S1) crosses a corresponding one of the active regions (A0, A1) and is connected to a source of the transistor at the crosspoint.

Each of the bit lines (for example, B01, B11, B21) formed perpendicular to the main surface of the substrate is connected to a corresponding one of the active regions (A0, A1). This means that the bit lines are connected to a drain of the transistor.

The conductive gate lines (G0, G1, G2) are formed, in the plane, in the direction perpendicular to the direction in which the active regions (A0, A1) and the source lines (S0, S1) are formed, and connected to the active regions (A0, A1) and the source lines (S0, S1). The transistor is switched between on and off by controlling a voltage or a current applied to the conductive gate lines (G0, G1, G2).

In addition, separate gate lines (SE0, SE) are formed parallel to the gate lines in the plan and connected to the active regions (A0, A1). The separate gate lines (SE0, SE) shut off, at contact points with the active regions (A0, A1), an active current flowing through the active regions (A0, A1).

A repeatedly disposed minimum cell region according to Embodiment 4 is represented by a dotted box in (b) in FIG. 7. The size of the minimum cell region is represented using a minimum fabrication size "F". In the present application, the minimum fabrication size "F" corresponds to F=(L+S)/2, where the minimum width of a formed line (a gate line, for example) is L and a space between two adjacent lines (between two gate lines, for example) is S. Accordingly, (b) in FIG. 7 shows that the width of the minimum cell is approximately 3 F and the height is approximately 2 F. Thus, the minimum cell occupies a region of approximately 6 $F^2$.

Embodiment 5

FIG. 8 to FIG. 11 show sectional views and top views in processing illustrating the method of manufacturing the non-volatile memory device 30 according to Embodiment 2 of the present invention.

Figure 8:
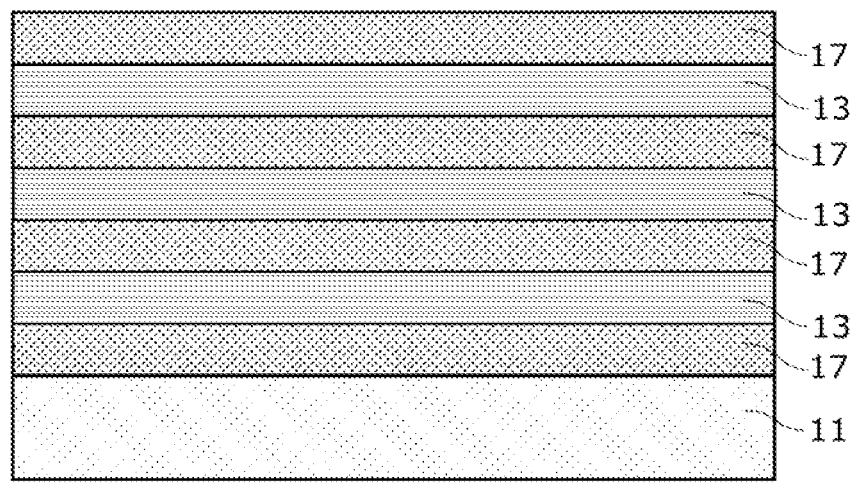
FIG. 8 is a cross-sectional diagram showing a stacking structure in the method of manufacturing the non-volatile memory device according to Embodiment 2 of the present invention.

First, in the step shown in FIG. 8, a stacked body is formed in which the conductive layers 13 and the interlayer insulating films 17 are alternately stacked above the substrate 11. The stacked body includes three conductive layers 13 disposed parallel to the substrate and four interlayer insulating films 17 each formed next to the conductive layers in the example shown in FIG. 8. However, the number of stacking is not particularly limited to that shown in this example.

Tantalum (Ta) or an oxygen-deficient tantalum oxide $TaO_x$ (resistivity is less than or equal to 10 mΩ·cm) is deposited as the first conductive layer 13 through sputtering, for example.

Figure 9:
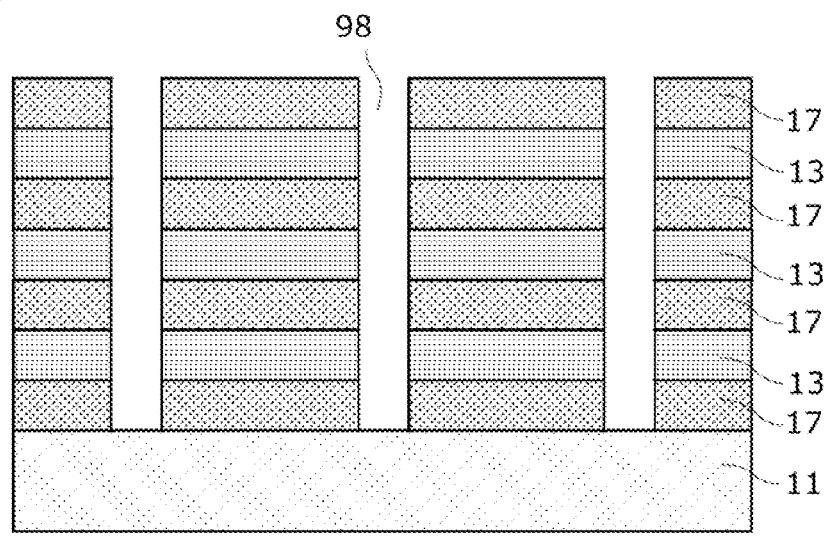
FIGS. 9 (a) and (b) in FIG. 9 show a cross-sectional diagram and a top view of a contact hole in the method of manufacturing the non-volatile memory device according to Embodiment 2 of the present invention.
Figure 9:
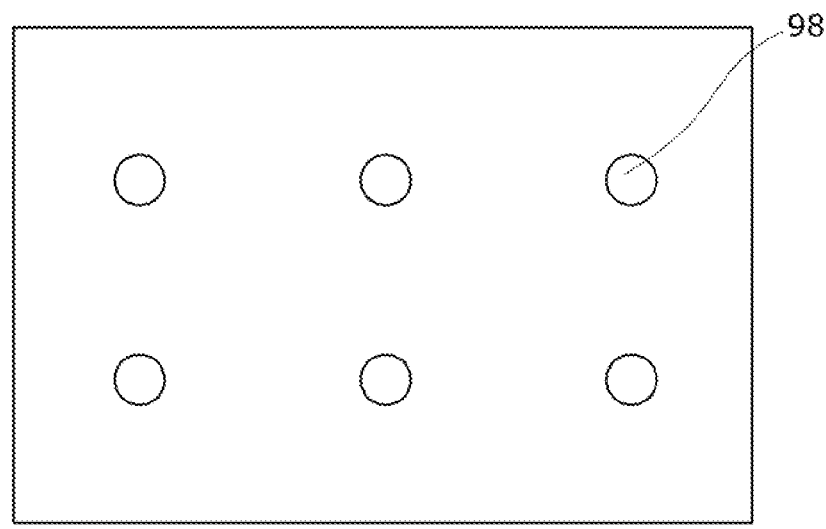

Next, in the step shown in (a) and (b) in FIG. 9, contact holes 98 are formed in the direction perpendicular to the main surface of the stacked body including the conductive layers 13 and the interlayer insulating films 17. First, a mask having a predetermined pattern is formed though general exposure process and development process. Next, the stacked body is etched using the formed mask to form each of the contact holes 98. Then, the mask is removed. Through the steps described above, the contact hole 98 is formed to which the conductive layers 13 and the interlayer insulating films 17 are exposed.

Figure 10:
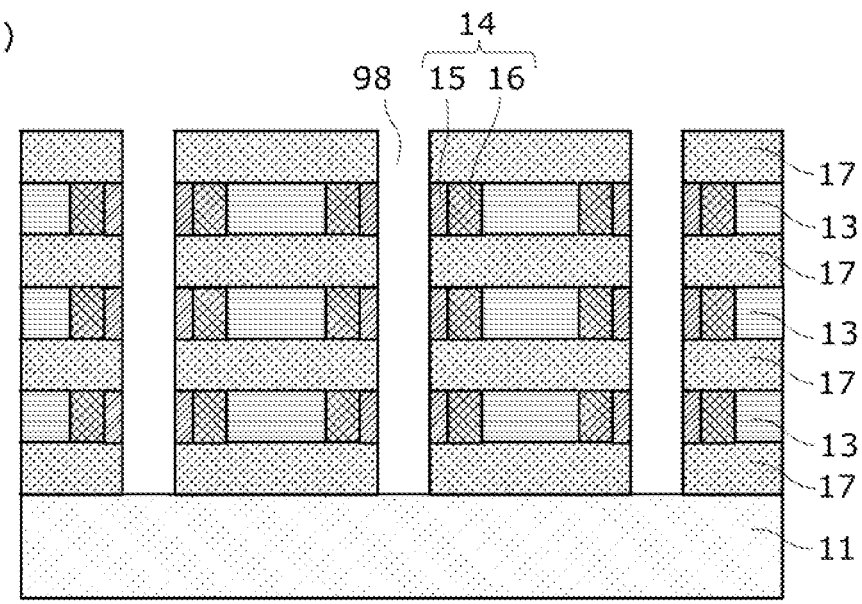
FIGS. 10 (a) and (b) in FIG. 10 show a cross-sectional diagram and a top view of a variable resistance layer in the method of manufacturing the non-volatile memory device according to Embodiment 2 of the present invention.
Figure 10:
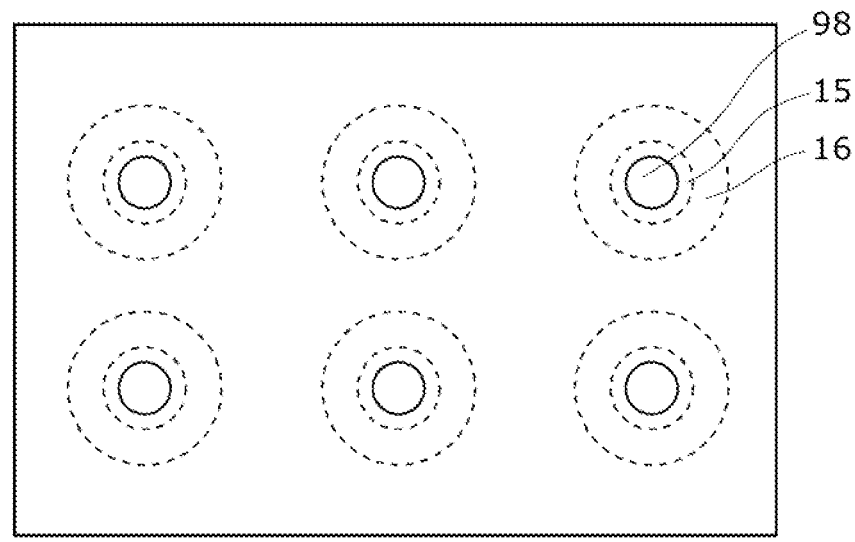

Next, in the step shown in (a) and (b) in FIG. 10, the conductive layers 13 exposed in each of the contact holes 98 are oxidized to form the variable resistance layers 14. For example, a plasma oxidation process is performed in an oxidation atmosphere with 1100 W of an application power for 30 seconds of processing time. Active oxygen, oxygen ions, or oxygen atoms diffuse from the surfaces of the conductive layers 13 exposed in the contact hole 98 toward an inside of the conductive layers 13. Due to these oxygen species, an oxide is formed which has a profile of a predetermined oxygen content in a region having a certain thickness from the contact hole 98 toward the conductive layers 13. The profile of the oxygen content is high near the contact hole 98 and continuously decreases toward the conductive layers 13. In this plasma oxidation process, the variable resistance layers 14 are formed to have a thickness of approximately 10 nm from the surface exposed in the contact hole 98. In each of the variable resistance layers 14, a first variable resistance layer 15 having a higher oxygen content is formed in a region including approximately 2 to 3 nm from the surface, and a second variable resistance layer 16 having a lower oxygen content is formed in a region including approximately 7 to 8 nm from the first variable resistance layer 15.

The plasma oxidation process is performed in an oxygen atmosphere according to the processes to form the variable resistance layer 14 as described above; however, the present invention is not limited to this. For example, heating treatment (hereinafter referred to as a thermal oxidation process) under an atmosphere including oxygen may be performed. The thermal oxidation process and the plasma oxidation process as described above are collectively called an oxidation process in the description below. In the present manufacturing method, since the variable resistance layer 14 is formed by performing oxidation process on part of the conductive layer 13, it is possible to simplify the conventional manufacturing procedures including the steps of embedding conductive layers. In addition, thickness control is easily conducted through the oxidation process compared to the embedding process, and thus the variable resistance layers 14 exposed in the contact hole 98 are formed to be uniform in thickness.

In addition, the oxidation process is not limited to being performed once. In addition, it is also possible to further clarify the difference between the oxygen content of the first variable resistance layer 15 and the oxygen content of the second variable resistance layer 16, by performing the oxidation process twice. For example, after weakly oxidizing part of the conductive layer 13 over a wide range through a weak oxidation process, only the surface of the conductive layer 13 exposed in the contact hole 98 of the conductive layer 13 is strongly oxidized through a strong oxidation process. Through these processes, the first variable resistance layer 15 having a high resistance value and the second variable resistance layer 16 having a low resistance value are formed. It is to be noted that the oxidation process may be performed more than once to more accurately control the oxygen content of the variable resistance layer 14.

Figure 11:
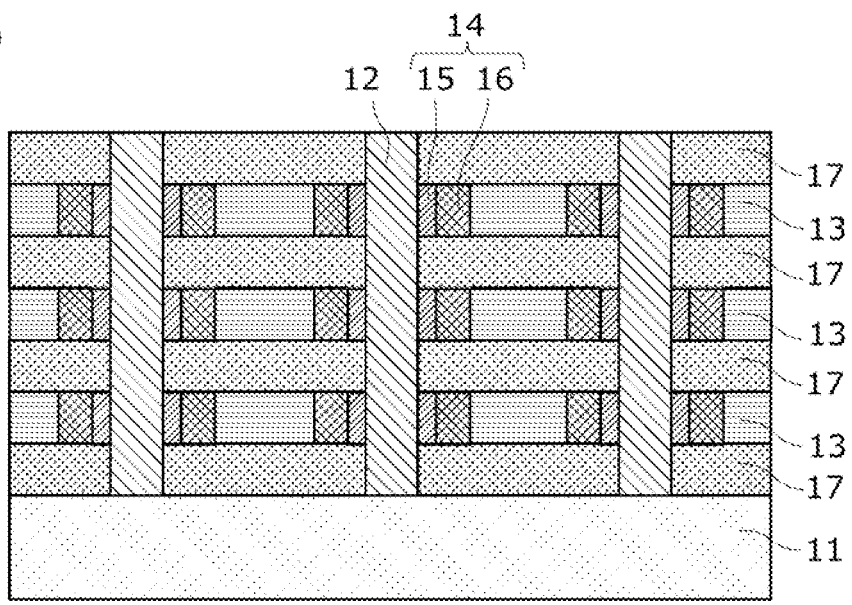
FIGS. 11 (a) and (b) in FIG. 11 show a cross-sectional diagram and a top view of pillar electrodes in the method of manufacturing the non-volatile memory device according to Embodiment 2 of the present invention.
Figure 11:
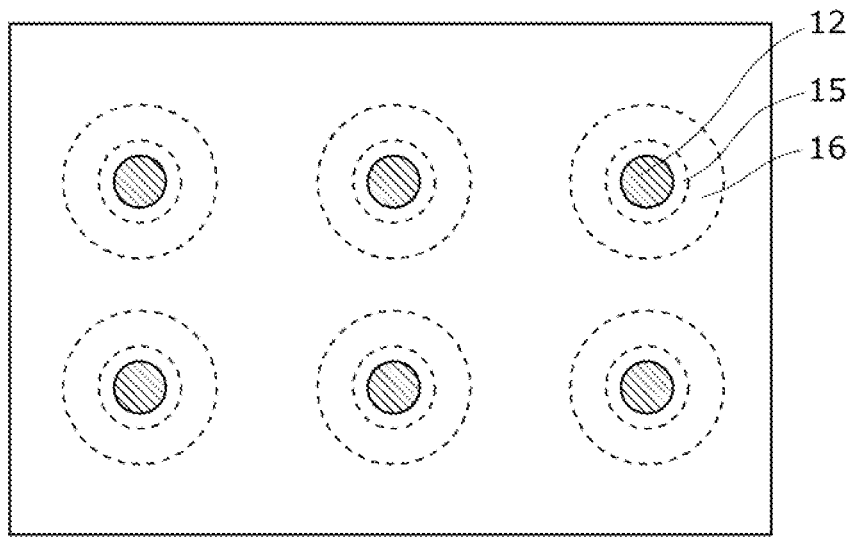

Next, in the step shown in (a) and (b) in FIG. 11, the pillar electrodes 12 are deposited in the contact holes 98 by sputtering, CVD, plating, or the like. As a material of the pillar electrode 12, a conductive material such as platinum (Pt), iridium (Ir), palladium (Pd), copper (Cu), and tungsten (W), are used, for example. Then, through CMP (chemical mechanical polishing) process and other planarization processes, unnecessary electrode materials which are deposited on the interlayer insulating film 17 are polished and removed to leave the pillar electrode 12 formed inside the contact hole 29. It is to be noted that the pillar electrode 12 is connected with the first variable resistance layer 15.

Through the processing described above, the formation of the non-volatile memory device 30 according to Embodiment 2 is accomplished.

Embodiment 6

Figure 12:
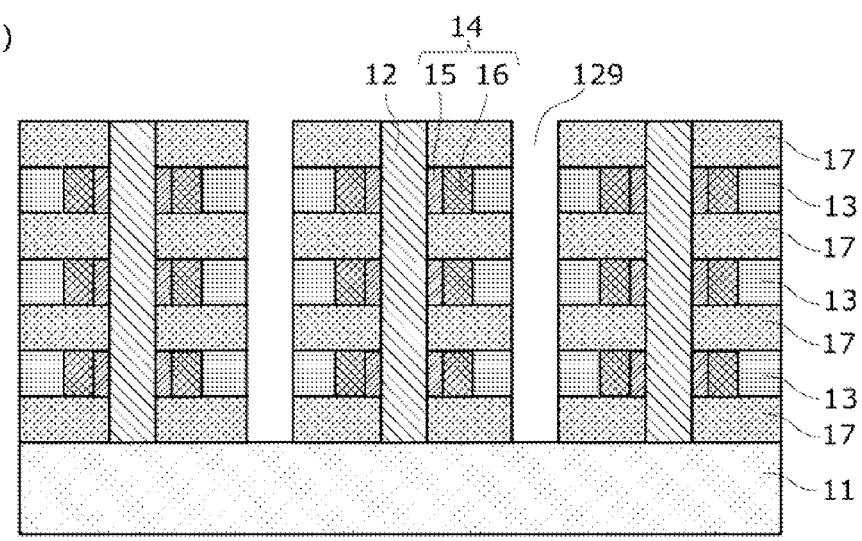
FIGS. 12 (a) and (b) in FIG. 12 show a cross-sectional diagram and a top view of a strip-shaped trench in the method of manufacturing the non-volatile memory device according to Embodiment 3 of the present invention.
Figure 12:
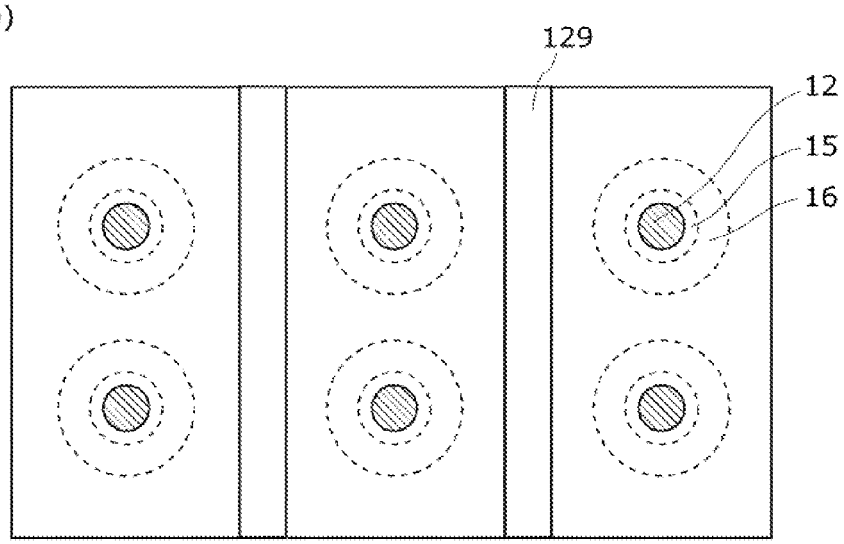
Figure 13:
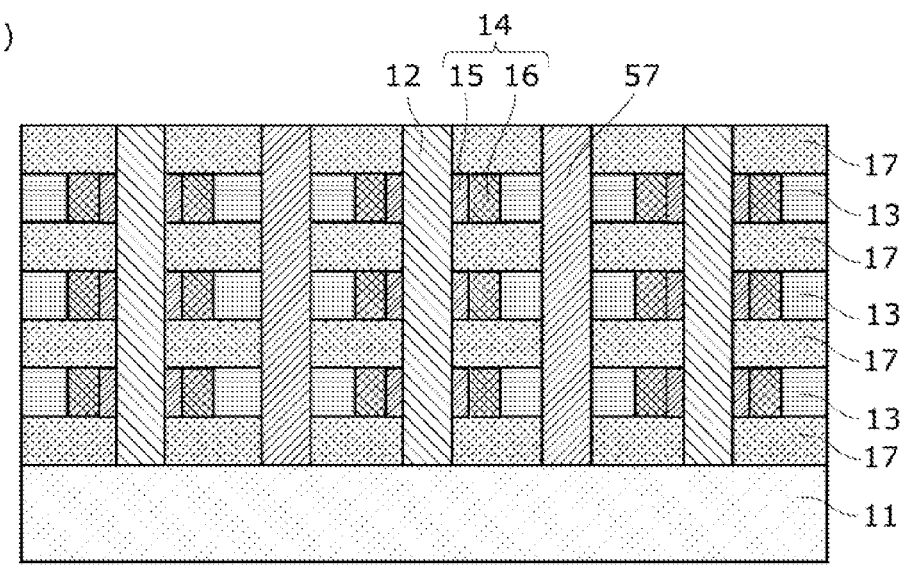
FIGS. 13 (a) and (b) in FIG. 13 show a cross-sectional diagram and a top view of an insulating layers in the method of manufacturing the non-volatile memory device according to Embodiment 3 of the present invention.
Figure 13:
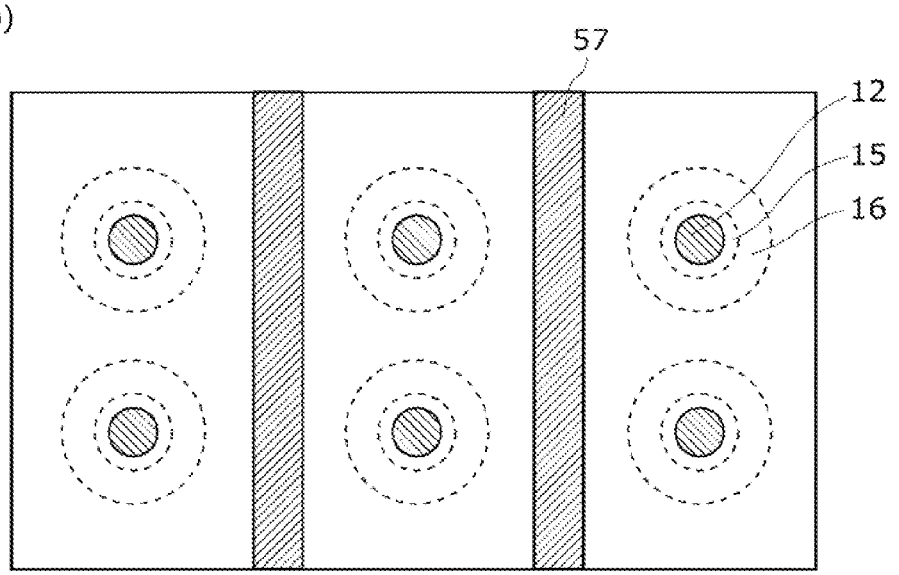
Figure 14:
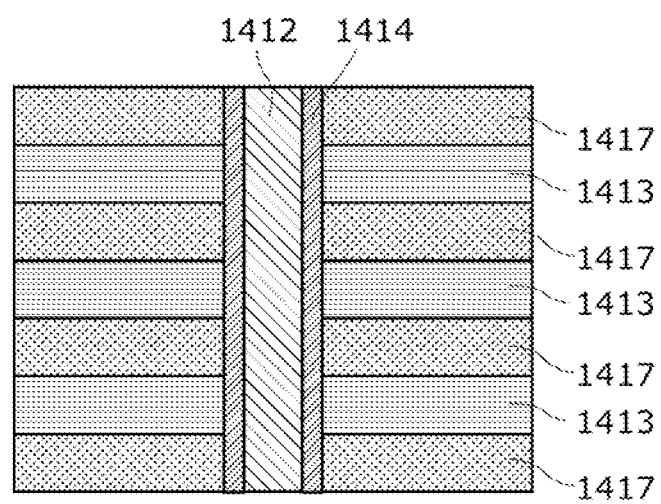
FIG. 14 is a cross-sectional diagram of the non-volatile memory device according to the conventional example.
Figure 15:
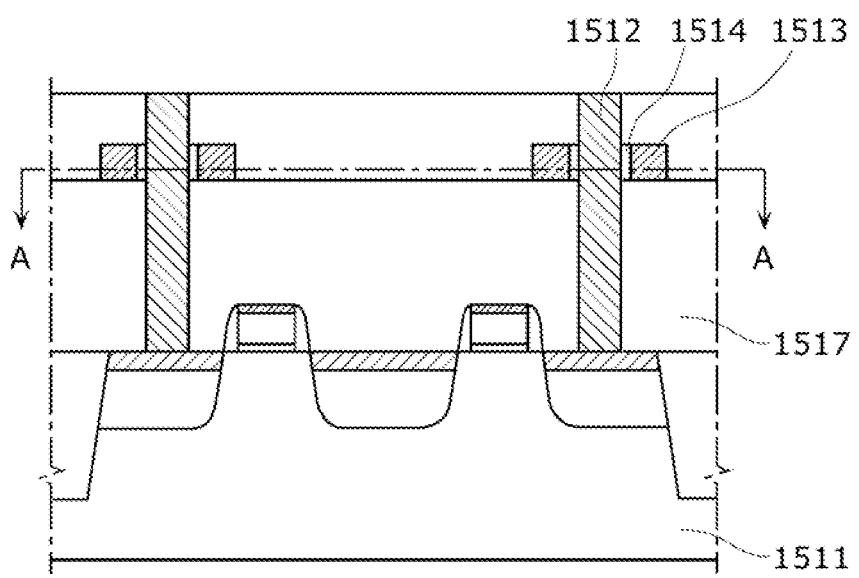
FIGS. 15 (a) and (b) in FIG. 15 show a cross-sectional diagram and a top view of a non-volatile memory element according to the conventional example.
Figure 15:
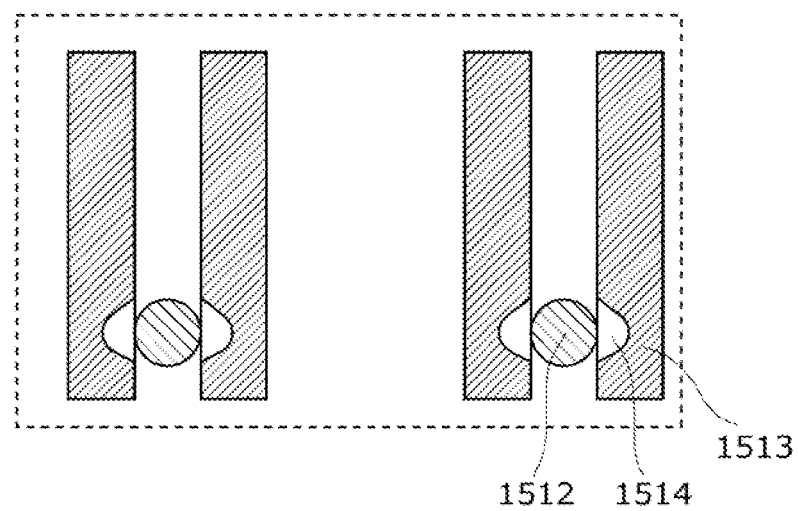

FIG. 12 and FIG. 13 show cross-sectional views and top views in processing illustrating the method of manufacturing a non-volatile memory apparatus 50 according to Embodiment 3 of the present invention.

Subsequent to the step shown in (a) and (b) in FIG. 11 according to Embodiment 5, strip-shaped trenches 129 are formed such that the pillar electrodes 12 are isolated for each predetermined row-portion, in the step shown in (a) and (b) in FIG. 12. Each of the strip-shaped trenches 129 is formed perpendicularly to the stacked body including the conductive layer 13 and the interlayer insulating film 17. First, a mask having a predetermined pattern is formed though general exposure process and development process. Next, the stacked body is etched using the formed mask to form the strip-shaped trench 129 in a direction perpendicular to the substrate 11. Then, the mask is removed.

Next, in the step shown in (a) and (b) in FIG. 13, an insulating layer 57 is deposited by CVD in the strip-shaped trench 129 previously formed. Then, through CMP process and other planarization processes, unnecessary insulating materials deposited on the interlayer insulating films 17 are polished and removed to leave the insulating layer 57 formed in the strip-shaped trench 129.

Through the processing described above, the formation of the non-volatile memory device 50 according to Embodiment 3 is accomplished.

With the configuration described above, it is possible to reduce a sneak leak current to an undetected memory cell, thereby enabling the reduction in power consumption.

It is to be noted that the manufacturing methods according to Embodiment 5 and Embodiment 6 are applicable, without being limited to the manufacturing of the non-volatile memory devices having the shape exemplified in Embodiment 2 and Embodiment 3.

In the manufacturing methods according to Embodiment 5 and Embodiment 6, it is apparent that, for example, the number of stacking of the conductive layer 13 and the interlayer insulating film 17 and the number of memory cells formed in a single layer can be arbitrary selected, and the strip-shaped trench 129 may be provided for a predetermined row unit, a predetermined column unit, or for a combination of a row unit and a column unit as described above.

Furthermore, it is possible to manufacture any electronic devices in which a variable resistance non-volatile memory element is included, by applying the above-described manufacturing method or combining the above-described manufacturing method and a known method.

INDUSTRIAL APPLICABILITY

The non-volatile memory device according to the present invention is useful as a next-generation non-volatile memory and the like which is directed to lower power consumption, higher-speed writing, higher-speed deleting, and larger capacity.

REFERENCE SIGNS LIST

10 non-volatile memory element
11 substrate
12 pillar electrode
13 conductive layer
14 variable resistance layer
15 first variable resistance layer
16 second variable resistance layer
17 interlayer insulating film
30, 40, 50 non-volatile memory device
41 selection circuit
57 insulating layer
98 contact hole
129 strip-shaped trench
1412 pillar electrode
1413 conductive layer
1414 variable resistance layer
1417 interlayer insulating film
1511 substrate
1512 pillar electrode
1513 conductive layer
1514 variable resistance layer
1517 interlayer insulating film

The invention claimed is:

1. A non-volatile memory element, comprising:
a pillar electrode disposed perpendicular to a main surface of a substrate;
a conductive layer disposed parallel to the main surface of the substrate to intersect with the pillar electrode, the conductive layer comprising a transition metal; and
a variable resistance layer disposed exclusively at an intersection between the pillar electrode and the conductive layer, the variable resistance layer comprising an oxide of the transition metal that is comprised in the conductive layer, and having (i) an inner side surface that surrounds an outer side surface of the pillar electrode, (ii) an outer side surface surrounded by the conductive layer, and (iii) a resistance value that reversibly changes according to an application of an electric signal.

2. The non-volatile memory element according to claim 1, wherein the variable resistance layer has an oxygen content that decreases from an interface between the pillar electrode and the variable resistance layer toward the conductive layer.

3. The non-volatile memory element according to claim 1, further comprising an other non-volatile memory element disposed adjacent to the non-volatile memory element in a direction parallel to the main surface of the substrate,
wherein the conductive layer is formed in an entire region between the variable resistance layer of the non-volatile memory element and an variable resistance layer of the other non-volatile memory element.

4. The non-volatile memory element according to claim 1, wherein the variable resistance layer is formed in a plane parallel to the main surface of the substrate, by oxidizing the conductive layer isotropically from the pillar electrode.

5. The non-volatile memory element according to claim 1, wherein the variable resistance layer is annularly formed to have a constant width.

6. A non-volatile memory device comprising:
a plurality of pillar electrodes disposed perpendicular to a main surface of a substrate;
a plurality of conductive layers disposed parallel to the main surface of the substrate to intersect with the pillar electrodes, each of the conductive layers comprising a transition metal;
a plurality of interlayer insulating films each of which is interposed between the conductive layers and which comprises an insulating material; and
a plurality of variable resistance layers each of which is disposed exclusively at an intersection between each of the pillar electrodes and a corresponding one of the conductive layers each of the variable resistance layers comprising an oxide of the transition metal that is comprised in each of the conduction layers, and having (i) an inner side surface that surrounds an outer side surface of the corresponding one of the pillar electrodes, (ii) an outer side surface surround by each of the conductive layers in a corresponding one of the layers, and (iii) a resistance value that reversibly changes according to an application of an electric signal.

7. The non-volatile memory device according to claim 6, wherein each of the variable resistance layers has an oxygen content that decreases from an interface between each of the variable resistance layers and the corresponding one of the pillar electrodes toward the corresponding one of the conductive layers.

8. The non-volatile memory element according to claim 6, wherein each of the conductive layers is formed in an entire region between the variable resistance layers which are placed adjacent to each other in a plane parallel to the main surface of the substrate.

9. The non-volatile memory device according to claim 6, wherein each of the variable resistance layers is formed in a plane parallel to the main surface of the substrate, by oxidizing the corresponding one of the conductive layers isotropically from the corresponding one of the pillar electrodes.

10. The non-volatile memory device according to claim 6, wherein each of the variable resistance layers is annularly formed to have a constant width.

11. The non-volatile memory device according to claim 6, wherein each of the variable resistance layers includes a first variable resistance layer and a second variable resistance layer which are stacked in a direction parallel to the main surface of the substrate, the second variable resistance layer having an oxygen content smaller than an oxygen content of the first variable resistance layer.

12. The non-volatile memory device according to claim 6, wherein each of the pillar electrodes is disposed at a corresponding one of crosspoints of rows and columns in a two-dimensional matrix defined on the main surface of the substrate.

13. The non-volatile memory device according to claim 12, wherein each of the conductive layers is electrically insulated for each portion composed of (i) a predetermined number of rows, (ii) a predetermined number of columns, or (iii) a predetermined number of rows and columns, in the two-dimensional matrix.

14. The non-volatile memory device according to claim 6, wherein the plurality of pillar electrodes comprise a material including one of platinum, iridium, palladium, copper, and tungsten.

15. The non-volatile memory device according to claim 6, wherein the transition metal comprised in the conductive layers and the variable resistance layers is tantalum.

16. The non-volatile memory device according to claim 6, further comprising
a selection transistor connected to one end of each of the pillar electrodes.

* * * * *